(12) United States Patent  
Orton

(10) Patent No.: US 6,617,859 B1
(45) Date of Patent: Sep. 9, 2003

(54) METHOD FOR DIAGNOSING INSULATION DEGRADATION IN UNDERGROUND CABLE

(76) Inventor: Harry E. Orton, 1894 Layton Drive, North Vancouver, British Columbia (CA), V7H 1X9

( * ) Notice: Subject to any disclaimer, the term of this patent is extended or adjusted under 35 U.S.C. 154(b) by 0 days.

(21) Appl. No.: 09/856,682

(22) PCT Filed: Nov. 19, 1999

(86) PCT No.: PCT/CA99/01098

§ 371 (c)(1),
(2), (4) Date: Jul. 12, 2001

(87) PCT Pub. No.: WO00/31556

PCT Pub. Date: Jun. 2, 2000

Related U.S. Application Data

(60) Provisional application No. 60/109,545, filed on Nov. 23, 1998.

(51) Int. Cl.[7] .............................................. H01H 31/02
(52) U.S. Cl. ...................................................... 324/544
(58) Field of Search ................................ 324/544, 551, 324/772; 250/227.17

(56) References Cited

U.S. PATENT DOCUMENTS

| 5,051,577 A | * | 9/1991 | Lutz et al. ............. 250/227.17 |
| 5,099,357 A | * | 3/1992 | Yokogawa et al. ......... 359/282 |
| 5,323,117 A | * | 6/1994 | Endoh et al. ................ 324/551 |
| 5,469,066 A | * | 11/1995 | Ito et al. ..................... 324/551 |
| 5,736,737 A | * | 4/1998 | Dawson et al. ......... 250/227.17 |
| 6,054,865 A | * | 4/2000 | Bald et al. .................. 324/551 |
| 6,335,814 B1 | * | 1/2002 | Fuse et al. ................... 359/182 |

FOREIGN PATENT DOCUMENTS

JP  7-151815  *  6/1995

* cited by examiner

*Primary Examiner*—Safet Metjahic
*Assistant Examiner*—Etienne P LeRoux
(74) *Attorney, Agent, or Firm*—Greer, Burns & Crain, Ltd.

(57) ABSTRACT

The invention provides a method of on-line diagnosis of insulation degradation in a portion of underground cable including measuring the current flow at first and second locations of the cable utilizing an optical current sensor at one of a number of current frequencies, determining the current flow differential at that frequency, and analyzing the results of the current flow differential determination according to a corrosion test, a partial discharge analysis, a harmonic current analysis or a tangent delta diagnostic.

9 Claims, 1 Drawing Sheet

METHOD FOR DIAGNOSING INSULATION DEGRADATION IN UNDERGROUND CABLE

This application claims the benefit of provisional application No. 60/109,545 filed Nov. 23, 1998.

TECHNICAL FIELD

The invention relates to methods of testing insulated underground power cables for degradation of the insulation, and more particularly to on-line diagnostic methods.

Background Art

Electrical power is typically distributed throughout the world using insulated underground power cables. Such power cables typically consist of a conductive core of a bundle of conducting strands, surrounded by a semi-conducting shield layer, an insulation layer, a second semi-conducting shield layer, a layer of metallic tape or helical concentric neutral conducting strands, and a polymeric jacket or sheath. The insulation on such power cables has a typical lifetime of about 30 to 40 years. However various factors can cause premature degradation of the insulation and resultant failure of the cable. One typical form of degradation is "water treeing". Polymer insulation absorbs moisture over time, and collections of moisture in the power cable insulation under electrical stress are referred to as "water trees". Such water trees can cause capacitive leakage current distortion from the central conductor which over time and under certain electrical conditions can lead to electrical treeing and ultimately complete failure of the cable. Similarly, partial discharges and electrical treeing can occur due to the presence of imperfections such as cavities or contaminants or particles in the insulation layer within the cable or its accessories. Such treeing can cause premature failure of the power cables.

It is important therefore for utilities to be able to test power cables for degradation to allow replacement prior to failure and to permit an orderly replacement schedule. Preferably such testing would be done "live", that is without de-energising the cable prior to testing. While the Japanese power system which uses ungrounded delta connected cables has permitted live testing because of its different grounding arrangement, North American power cables and in most other countries world-wide, use grounded, star connected cables that have required in the past that the cable be de-energising for testing. There is therefore a need for a diagnostic method which permits on-line, non-destructive live diagnostics in the North American and world-wide cable systems. While various on and off line diagnostics are known, they generally require different methods of detecting the current leakage, and consequently it is not possible to carry out multiple diagnostics using the same measurement set-up.

Disclosure of Invention

The invention provides a method of on-line diagnosis of insulation degradation in a portion of underground cable comprising:

i) measuring the current flow at first and second locations of the cable utilizing an optical current sensor at one of a plurality of current frequencies:

ii) determining the current flow differential at said one frequency;

iii) analysing the results of the current flow differential determination according to one or more of the following diagnostic analyses to assess the need for cable replacement:

a) a corrosion test on the cable to ensure the safety of conducting tests thereon;

b) a partial discharge analysis; and c) one of the following two diagnostics, depending on the type of insulation material:

i) a harmonic current analysis if the insulation layer is cross-linked polyethylene or ethylene propylene rubber, or ii) a tangent delta or loss angle diagnostic if the insulation layer is paper insulated lead covered or ethylene propylene rubber.

BRIEF DESCRIPTION OF DRAWINGS

In drawings which illustrate a preferred embodiment of the invention.

BEST MODE(S) FOR CARRYING OUT THE INVENTION

Figure 1:
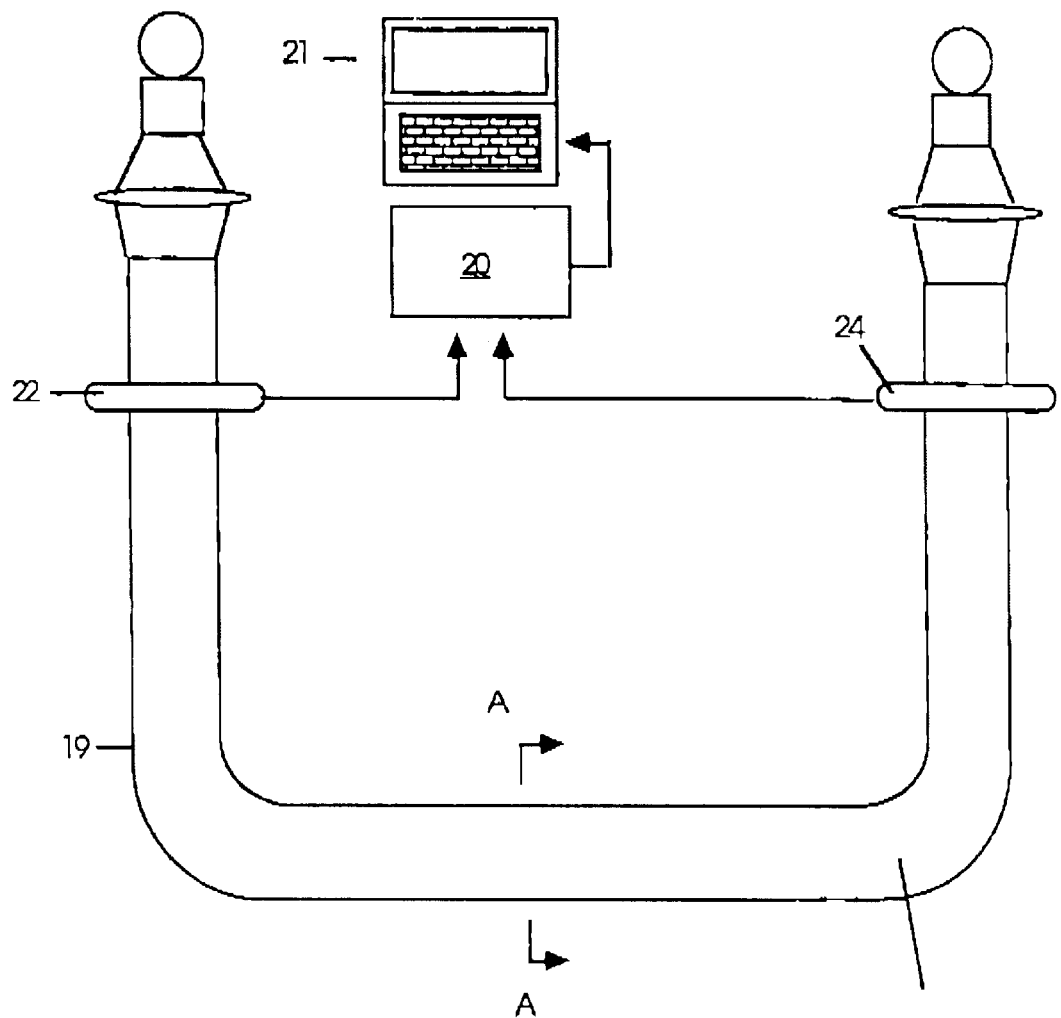
FIG. 1 is a schematic illustration of an underground cable system on which the invention is performed.
Figure 2:
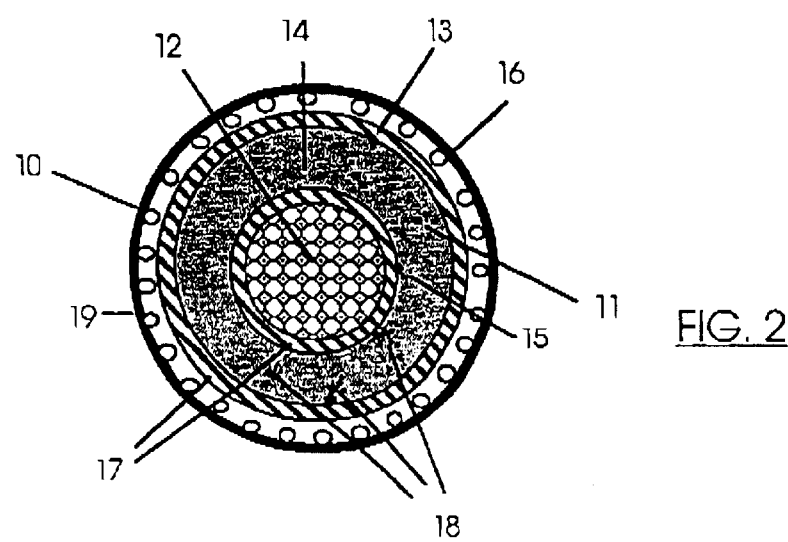
FIG. 2 is a cross-section taken along lines A—A of FIG. 1.

With reference to FIGS. 1 and 2, a standard underground power cable (not to scale), designated as 10, carries an electric current, typically a rated maximum 200/600 amperes at 50/60 hertz. The cable consists of a stranded conductor 12, concentric neutral wires (also referred to as "ground wires" or "drain wires") 16 which are grounded, polymer insulation layer 14, polymer semiconductor shields 17 and insulating jacket 19. Water trees 18 have developed in insulation layer 14 usually at voids or contaminants 11 or at protrusions 13, 15.

Extremely accurate optical current sensors 22 and 24, which may be fibre optic, slab or crystal, are now available to measure the flow of current in the cable. Such sensors must have a resolution of $5 \times 10^{-6}$ amperes. Optic sensors of this general type are manufactured currently by 3M Corp and others. A suitable optical current sensor is slipped on to the cable ends or wrapped around or clipped over the cable. The light within the fibre, slab or crystal is perturbed by the electromagnetic field produced by the current in the conductor and can be calibrated to measure the current in the conductor with sufficient accuracy and linearity. The output from the optical current sensors is communicated to central processing unit 20 which calculates the difference between the cable conductor current flows at 22 and 24 at different frequencies. Readings are taken at different frequencies according to the diagnostic performed, whether 50/60 hertz, 150/180 hertz, greater than or equal to 50 kilohertz, or direct current. The differential is then processed, and displayed on laptop computer 21. The data is analyzed by the laptop software and recommendations are made on cable replacement based on that analysis. To reduce the effects of background noise, time averaging of the data is carried out over a twenty minute period. Multiple cable sample analyses are possible at one time increasing the utilisation factor of the diagnostic. The present cable diagnostic method can thus combine at least four technologies into the one on-line unit thereby increasing the diagnostic capabilities.

Corrosion of the concentric neutral wires 16 occurs when the concentric neutral wires are exposed to ground without the protection of an insulating jacket 19. Corrosion will also occur on a damaged or punctured jacket that allows the current to pass from the concentric neutral wires to ground. Corrosion currents may continue to flow until the concentric neutral wires are completely eroded away and unsafe voltages can occur on the cable. At this point the cable is a safety hazard and must be replaced immediately as specified by the Electrical Safety Code. As a first step in the diagnostic procedure therefore it is normally advisable to ensure that the concentric neutral wires are intact and to detect any corrosion of the concentric neutral wires, to avoid a safety hazard. The corrosion test may be conducted either at 60 hertz or dc (direct current). The method of carrying out a corrosion test currently is described in the following publications: F. Escalante, U. Bertocci et al., "Development of In-situ Techniques for the Detection of Corrosion of Copper Concentric Neutrals of Electric Cables in Underground Environments" *IEEE Transactions on Power Apparatus and Systems*, Vol. PAS-101, No. 7, July 1982, p. 2061; K. G. Compton, "Corrosion of Concentric Neutrals of Buried URD Cable", *IEEE Transactions on Power Apparatus and Systems*, Vol. PAS-101, No. 6, June 1982, p. 1651; "Protecting Copper Underground", EPRI Journal, March 1983, p. 20. In the present invention, the test is carried out using the optical current sensor by positioning the sensors 22, 24 on the concentric neutral wires on the outside of the insulation layer 14. Existing methods use Time Domain Reflectrometry, Ground Penetrating Radar, Step Potentials, resistance measurements, and ground gradients, but none of the existing methods utilize an optical current sensor.

If the concentric neutral wires are not corroded to an extent which might be a hazard, then the diagnostic method can be continued.

It has been found that the following diagnostic can then be carried out to analyze the deterioration of the cable based on the measurements taken by sensors 22, 24.

1. Partial Discharge Analysis

Regardless of the type of material used for insulation layer 14, a partial discharge analysis at 50 kilohertz or greater is conducted to help locate discrete problem areas made evident by partial discharge activity within the cable insulation system including the cable accessories (terminations, separable connectors and splices) and the cable insulation. Imminent failures can be established and forced outages avoided through this analysis. Previously this analysis has been done using a "capacitance tap" or by installing a metal electrode to provide capacitive coupling to the cable and its accessories. Prior methods of carrying out a partial discharge test are described in the following publications: R. Bartnikas, "Power Factor and Corona Discharge Test" in *Power Cable Engineering*, Chapter IX, p. 263 (Sandford Educational Press, 1987); R. Bartnikas, "Corona Measurement and Interpretation" *in Engineering Dielectrics* Vol. 1, R. Bartnikas and E. J. McMahon, editors, STP 669 (ASTM Press, Philadelphia, 1979); L. A. El-Zeftawy and T. D. Eish "Analytical and Experimental Investigation on Cable Insulation", Modelling Simulation and Control A: General Physics Matter and Waves, *Electrical and Electronics Engineering* Vol. 27, No. 3, 1990 pp 403–408; R. D. Naybour, "Examination of the Breakdown in New and Aged Polyethylene Cables", *Proceedings on the 3rd Conference on Conduction and Breakdown in Solid Dielectrics*, 1989, Trondheim, Norway, pp 61–65; T. Tanaka, M. Watanabe and K. Yatsuka, "Detecting the Breakdown Causes of LPE Cable by the PPD Method", *Revue Generale de l'Electricite*, No. 1, January 1992, pp. 35–39; L. A. Dissado and J. C. Fothergill, "Partial Discharge and Free Volume Breakdown", *Electrical Degradation and Breakdown in Polymers*, Ch. 13, Peter Peregrinus Ltd. In the present invention, however, the diagnostic is conducted by directly measuring the current flow at sensors 22, 24 and analysing the differential.

A second diagnostic is also conducted, depending on the material of the insulation layer 14. If the insulation layer is cross-linked polyethylene or EPR (ethylene propylene rubber), then a harmonic current analysis is conducted. If the insulation layer is paper insulated lead covered or EPR then a tangent delta or loss angle diagnostic is used.

2(A). Harmonic Current Analysis (150/180 Hz)

Whereas there is a healthy leakage current of about 10 mA at 60 hertz, a badly deteriorated cable will show a leakage current (differential) of about 300 microamps at 180 hertz (150 hertz outside North America). 50 to 200 microamps shows there is moderate deterioration. The method of carrying out the harmonic current analysis is described in the following publications: K. Hirotsu, K. Hosoe et al., "Development of Hot-line Diagnosis Method for XLPE Cables by Measurement of Harmonic Current" in *Proceedings of the Symposium on Electrical Insulation Materials*, Osaka, Japan, September 1994, Vol. 26, pp. 455–458: J. Densley, "Aging and Diagnostics in Extruded Insulation for Power Cables" in *Proceedings of the 6th International Conference on Conduction and Breakdown in Solid Dielectrics*, Jun. 22–25, 1998, Vasteras, Sweden; J. Densley, "Didactic", *IEEE ICC Minutes*, November 1997, St. Petersburg, Fla. This method has been utilized in Japan on ungrounded cable systems but has not been used on North American systems.

2(B). Tangent Delta or Loss Angle Diagnostic

The 50/60 hertz leakage current (capacitive current) is measured and compared to the applied voltage of each cable to determine the dissipation factor (tangent $\delta$) of the cable insulation (measured at 60 hertz in North America, 50 hertz elsewhere). Comparative aging assessment between cables can be achieved by evaluation of dissipation factor values. For new cables, values less than $1.0e^{-04}$ can be expected whereas aged cables will have dissipation factors close to $1.0e^{-01}$. Cable replacement priority can be easily determined from this analysis. The method of carrying out the tangent delta test is described in the following publications: R. Bartnikas, "Power Factor and Corona Discharge Test" in *Power Cable Engineering*, Chapter IX, p. 263 (Sandford Educational Press, 1987). Again, this method has not been carried out using optical current sensors.

In this way a single current sensor set up can be used to carry out multiple diagnostics. By carrying out two or more of the diagnostics a more complete and accurate analysis of the deterioration of the cable can be obtained. Further, by conducting all of the tests using a single measuring equipment set-up and single diagnostic unit, instead of four different diagnostic devices, the speed of analysis is increased and cost of the diagnostics greatly reduced. The fact that all the diagnostics can be conducted on-line reduces the switching costs incurred in de-energizing the cable. Further, switching surge damage can occur to the cable insulation during the switching required to prepare the cable for off-line diagnostics as well as during re-energizing when reconnecting the cables for service.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method of diagnosis of insulation degradation in a portion of underground electric distribution cable comprising the steps of:

i) measuring the current flow at first and second locations of the cable utilizing a current sensor at a plurality of current frequencies or direct current;

ii) determining the current flow difference at each said frequency or direct current;

iii) analysing the results of the current flow difference determination according to one or more of the following diagnostic analyses to assess the need for cable replacement:
   i) a harmonic current analysis, or
   ii) a tangent delta or loss angle diagnostic; wherein such method is carried out on-line, without disconnection of said cable from the electric distribution circuit, the current flow is measured at said first and second locations of the cable utilizing first and second optical current sensors at a plurality of current frequencies or direct current, and the results of the current flow difference determination are analyzed according to one or more of the following diagnostic analyses to assess the need for cable replacement:
      a) a corrosion test on the cable to ensure the safety of conducting tests thereon by measuring the difference in the direct current in the concentric neutral wires of said cable between said first and second locations;
   and, if said concentric neutral wires are not corroded to an extent which might be a hazard;
      b) a partial discharge analysis by determining whether partial discharge activity is present using existing methods of analyzing partial discharge applied to said current difference between said first and second locations; and
      c) one of the following diagnostics, depending on the type of insulation material:
         i) a harmonic current analysis if the insulation layer is cross-linked polyethylene, or
         ii) a tangent delta or loss angle diagnostic if the insulation layer is paper insulated lead covered, or
         iii) either or both of a harmonic current analysis and a tangent delta or loss angle diagnostic if the insulation layer is ethylene propylene rubber.

2. The method of claim 1 wherein said corrosion test is carried out at 50/60 hertz or direct current.

3. The method of claim 1 wherein said partial discharge analysis is carried out at 50 kilohertz or greater.

4. The method of claim 1 wherein said harmonic current analysis is carried out at 150/180 hertz.

5. The method of claim 1 wherein said tangent delta or loss angle diagnostic is carried out at 50 or 60 hertz.

6. The method of claim 1 wherein said optical current sensor is a fibre optical current sensor.

7. The method of claim 1 wherein said optical current sensor is a slab-type optical current sensor.

8. The method of claim 1 wherein said optical current sensor is a crystal-type optical current sensor.

9. The method of claim 1 wherein said corrosion test is first carried out, followed, if said concentric neutral wires are not corroded to an extent which might be a hazard, by said partial discharge analysis and one or both of either said harmonic current analysis or said tangent delta analysis.

* * * * *